United States Patent
Lee et al.

(10) Patent No.: US 12,105,421 B2
(45) Date of Patent: Oct. 1, 2024

(54) HIGHLY THICK SPIN-ON-CARBON HARD MASK COMPOSITION AND PATTERNING METHOD USING SAME

(71) Applicant: YOUNG CHANG CHEMICAL CO., LTD, Gyeongsangbuk-do (KR)

(72) Inventors: Su Jin Lee, Daegu (KR); Gi Hong Kim, Daegu (KR); Seung Hun Lee, Daegu (KR); Seung Hyun Lee, Daegu (KR)

(73) Assignee: YOUNG CHANG CHEMICAL CO., LTD, Gyeongsangbuk-Do (KR)

( * ) Notice: Subject to any disclaimer, the term of this patent is extended or adjusted under 35 U.S.C. 154(b) by 266 days.

(21) Appl. No.: 17/442,908

(22) PCT Filed: Mar. 25, 2020

(86) PCT No.: PCT/KR2020/004041
§ 371 (c)(1),
(2) Date: Sep. 24, 2021

(87) PCT Pub. No.: WO2020/209527
PCT Pub. Date: Oct. 15, 2020

(65) Prior Publication Data
US 2022/0179318 A1 Jun. 9, 2022

(30) Foreign Application Priority Data
Apr. 9, 2019 (KR) .......................... 10-2019-0041402

(51) Int. Cl.
*G03F 7/11* (2006.01)
*C09D 165/00* (2006.01)

(52) U.S. Cl.
CPC .............. *G03F 7/11* (2013.01); *C09D 165/00* (2013.01)

(58) Field of Classification Search
CPC ............ C08G 61/10; C08G 2261/1422; C08G 2261/312; C08G 2261/314; C08G 2261/43; C08G 2261/76; C07C 69/54; C07C 37/20; C07C 39/16; C07C 67/14
See application file for complete search history.

(56) References Cited

U.S. PATENT DOCUMENTS

| | | | |
|---|---|---|---|
| 2009/0176165 A1 | 7/2009 | Cheon et al. | |
| 2012/0168894 A1 | 7/2012 | Kim et al. | |
| 2016/0257842 A1* | 9/2016 | Wakamatsu | ......... C09D 161/34 |
| 2016/0355699 A1 | 12/2016 | Kim et al. | |

(Continued)

FOREIGN PATENT DOCUMENTS

| | | |
|---|---|---|
| CN | 101641390 A | 2/2010 |
| JP | 2016-206586 A | 12/2016 |

(Continued)

*Primary Examiner* — Shane Fang
(74) *Attorney, Agent, or Firm* — NKL Law; Jae Youn Kim

(57) ABSTRACT

Proposed is a composition for a thick hard mask suitable for use in a semiconductor lithography process, and particularly a spin-on carbon hard mask composition and a patterning method of forming a hard mask layer by applying the composition on an etching target layer through spin coating and baking the composition. The composition has high solubility characteristics, thereby enabling the formation of a thick hard mask which can exhibit high etching resistance to tolerate multiple etching processes and excellent mechanical properties.

7 Claims, 1 Drawing Sheet

(56) References Cited

U.S. PATENT DOCUMENTS

2017/0176861 A1\* 6/2017 Nam ................. C08G 61/12
2020/0041904 A1\* 2/2020 Tsuchiya ............ H01L 21/0332

FOREIGN PATENT DOCUMENTS

| JP | 2018-052832 A | 4/2018 |
|---|---|---|
| KR | 10-2016-0087101 A | 7/2016 |
| KR | 10-1777687 B1 | 9/2017 |
| KR | 10-2018-0106833 A | 10/2018 |
| WO | 2018/070785 A1 | 4/2018 |

\* cited by examiner

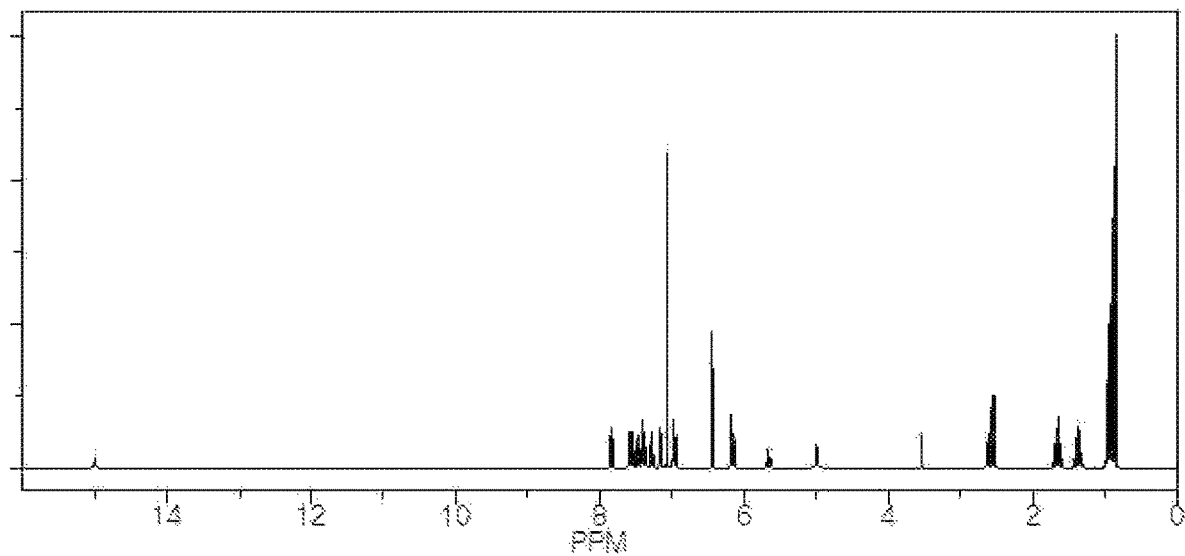

HIGHLY THICK SPIN-ON-CARBON HARD MASK COMPOSITION AND PATTERNING METHOD USING SAME

TECHNICAL FIELD

The present disclosure relates to a composition for a thick hard mask suitable for use in a semiconductor lithography process, the composition enabling the formation of a thick hard mask due to high solubility characteristics thereof, and to a patterning method using the same composition.

BACKGROUND ART

With the recent trend toward the miniaturization and high integration of semiconductor devices, there has been a demand for the realization of fine patterns. For the formation of such fine patterns, making a photoresist pattern finer through the development of exposure equipment or the introduction of an additional process is regarded as efficient.

To increase the integration density of semiconductor devices and to enable the formation of structures having nanometer scale dimensions, high-resolution photoresists and photolithography tools are being developed.

During the manufacture of a semiconductor device in the past, an i-line light source with a wavelength of 365 nm has conventionally been used to form a pattern on a semiconductor substrate. However, a light source with a wavelength in a shorter wavelength band is required to form a finer pattern.

Lithography techniques using KrF (248 nm), ArF (198 nm), and extreme ultra violet (EUV, 13.5 nm) light sources have been developed and commercialized or are currently being commercialized. These techniques make it possible to realize finer wavelengths.

As patterns become finer, a photoresist film needs to be thinner to prevent photoresist patterns collapsing. However, since it is difficult to etch an etching target layer with a thin photoresist pattern, an intermediate film having good etching resistance needs to be disposed between the photoresist layer and the etching target layer. The intermediate film is referred to as a hard mask. A hard mask process refers to a process in which a hard mask layer is etched and patterned with a photoresist pattern to form a pattern (i.e., hard mask), and the underlying layer is etched using the hard mask to form a device pattern. The hard mask layer is typically formed through chemical vapor deposition (CVD) or spin-on coating.

The hard mask layer manufactured through the CVD process has some drawbacks, such as increased initial investment cost attributable to the use of evaporators, increased processing time, and generation of undesired particles, and the like. To overcome such drawbacks, many efforts have been made to reduce the cost and processing time using a material suitable for spin coating rather than deposition in the hard mask process.

A hard mask process based on the spin-on coating technique has merits in that the initial investment cost is low compared to the CVD technique, the coatability is improved, the coating thickness can be easily controlled, and the processing time can be shortened.

Meanwhile, as a semiconductor manufacturing process has become increasingly miniaturized in recent years, the height of the hard mask layer has become higher in order to reduce the pattern linewidth. This calls for the development of an improved novel hard mask material which has high solubility characteristics capable of realizing high thickness.

DISCLOSURE

Technical Problem

Accordingly, the present disclosure has been made keeping in mind the above problems occurring in the related art, and an objective of the present disclosure is to provide a composition and a patterning method using a thick spin-on carbon hard mask during the manufacture of a semiconductor device, and particularly a composition enabling the formation of a thick hard mask due to high solubility characteristics thereof and a patterning method using the same composition.

Technical Solution

One aspect of the present disclosure provides a spin-on carbon hard mask composition including: a polymer having a weight average molecular weight of 2,000 to 200,000, and having a structure represented Chemical Formula 1 below.

[Chemical Formula 1]

In Chemical Formula 1, l, m, and n may be 1≤l≤40, 1≤m≤40, and 1≤n≤40, respectively, $R_1$ may include any one selected from among hydrogen (H), a hydroxyl group (OH),

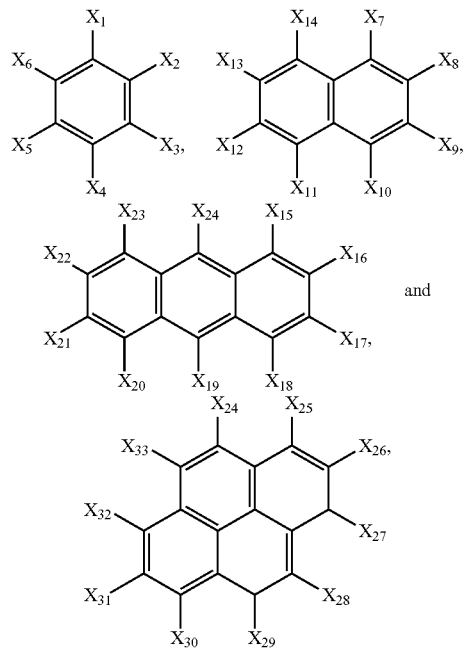

and $R_2$ may include any one selected from among,

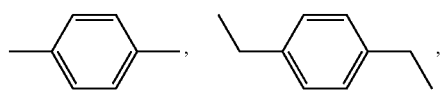

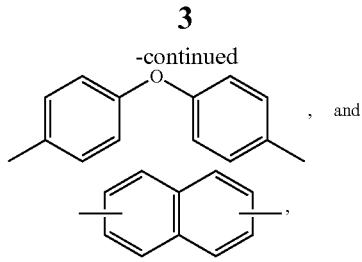
and and $R_3$ may include any one selected from among

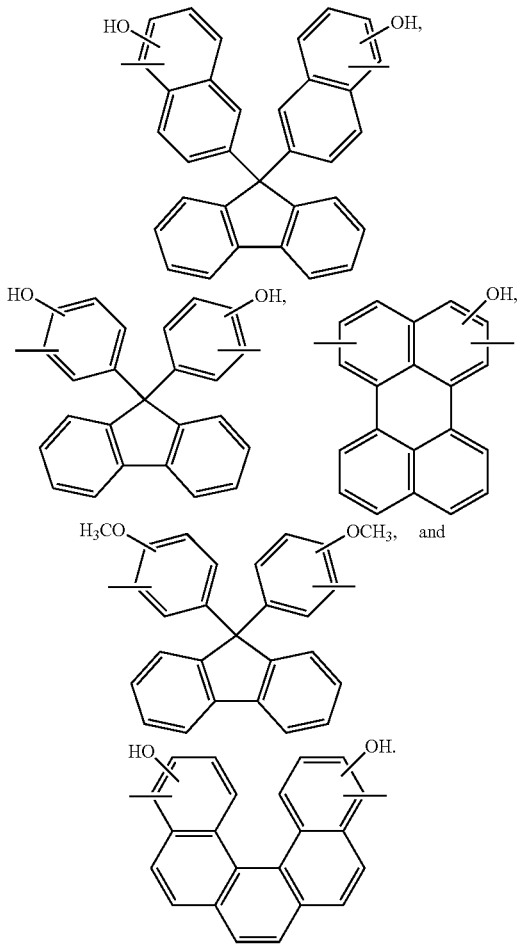

In $R_1$ in Chemical Formula 1, $X_1$ to $X_{35}$ each independently may include hydrogen, a hydroxyl group, a substituted or unsubstituted $C_1$ to $C_3$ alkyl group, or a combination thereof.

In the above aspect of the present disclosure, the spin-on hard mask composition may include 1% to 50% by weight of the polymer, 50% to 99% by weight of the organic solvent, and 0% to 2% by weight of the surfactant.

In the above aspect of the present disclosure, the organic solvent may be one or a mixture of at least two selected from the group consisting of propylene glycol monomethylether (PGME), propylene glycol monomethylether acetate (PGMEA), cyclohexanone, γ-butyrolactone, ethyl lactate (EL), methyl ethyl ketone, n-butyl acetate, N-methylpyrrolidone (NMP), methyl 3-methoxypropionate (MMP), ethyl 3-ethoxypropionate (EEP), and dimethylformamide (DMF).

In the above aspect of the present disclosure, the surfactant may be one or a mixture of at least two selected from the group consisting of nonionic surfactants, such as polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene lauryl ethers, and polyoxyethylene sorbitans.

Another aspect of the present disclosure provides a patterning method including forming a hard mask layer by: applying the spin-on hard mask composition on an etching target layer through spin coating; and baking the composition.

In the above aspect of the present disclosure, the baking may be performed at a temperature of 150° C. to 400° C. for 1 to 5 minutes, thereby forming the hard mask layer.

Advantageous Effects

A spin-on hard mask composition according to the present disclosure enables the formation of a thick hard mask due to high solubility characteristics thereof. The thick hard mask can exhibit high etching selectivity and sufficient resistance to multiple etching processes, thereby exhibiting excellent performance when used in the formation of a semiconductor fine pattern.

DESCRIPTION OF DRAWINGS

FIG. 1 is an $^1$H-NMR spectrum of a polymer prepared in Example 1.

BEST MODE

Hereinafter, a detailed description will be given of the present disclosure.

One aspect of the present disclosure pertains to a spin-on carbon hard mask composition having a structure represented by Chemical Formula 1, and having a weight average molecular weight of 2,000 to 200,000, preferably 2,500 to 20,000, and more preferably 3,500 to 15,000.

[Chemical Formula 1]

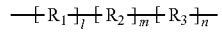

In Chemical Formula 1, l, m, and n are $1 \leq l \leq 40$, $1 \leq m \leq 40$, and $1 \leq n \leq 40$, respectively, $R_1$ includes any one selected from among hydrogen (H), a hydroxyl group (OH),

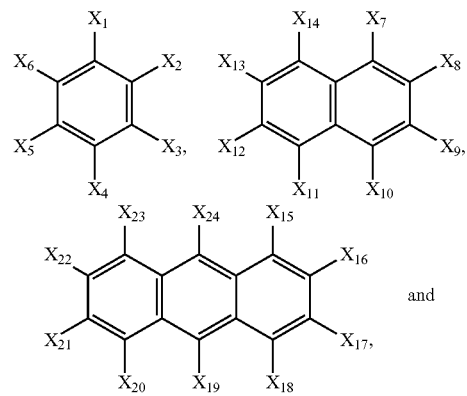

-continued

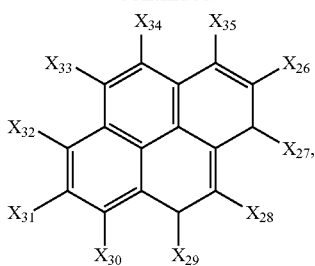

$R_2$ includes any one selected from among,

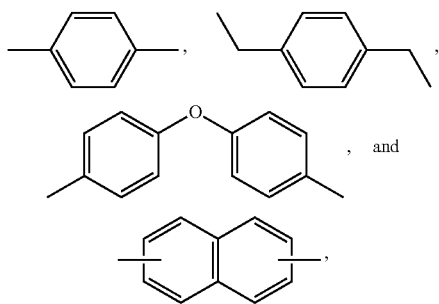

and $R_3$ includes any one selected from among

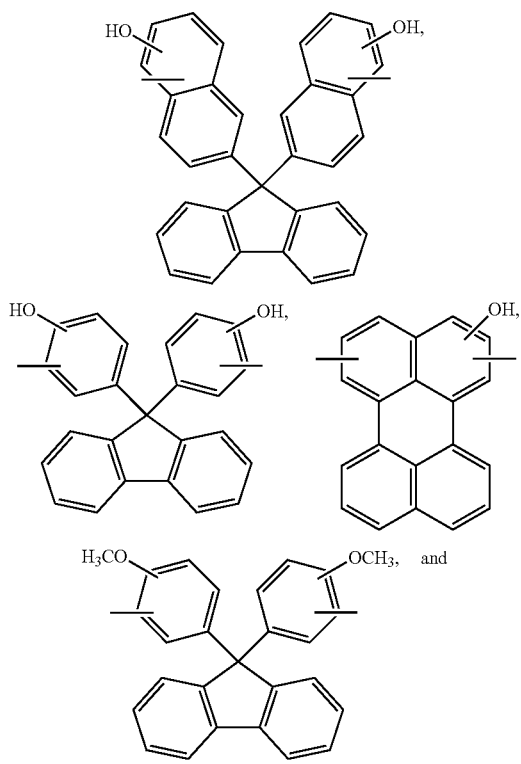

-continued

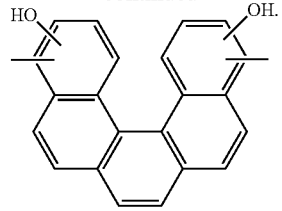

In $R_1$ in Chemical Formula 1, $X_1$ to $X_{35}$ each independently include hydrogen, a hydroxyl group, a substituted or unsubstituted $C_1$ to $C_3$ alkyl group, or a combination thereof.

In Chemical Formula 1, $R_2$ is mainly used under an acid catalyst condition and plays the role of increasing the solubility of a formed polymer in an organic solvent.

In Chemical Formula 1, $R_3$ mainly plays the role of improving the thermosetting reactivity and etching selectivity of the entire polymer structure.

The polymer represented by Chemical Formula 1 has a weight average molecular weight of 2,000 to 200,000, preferably 2,500 to 20,000, and more preferably 3,500 to 15,000.

When the weight average molecular weight of the polymer represented by Chemical Formula 1 is less than 2,500, a sufficient amount of the polymer structure is not formed, thereby lowering etching resistance. On the other hand, when the weight average molecular weight thereof exceeds 20,000, the properties of the coated surface may become non-uniform.

The hard mask composition may include 1% to 50% by weight of the polymer represented by Chemical Formula 1, 50% to 99% by weight of an organic solvent, and 0% to 2% by weight of a surfactant.

When the amount of the polymer is less than 1% by weight or exceeds 50% by weight, the coating thickness may be less than or exceeds a desired level, making it difficult to obtain an exact coating thickness. An excessive coating thickness may result in deteriorated coatability.

The organic solvent may be one or a mixture of at least two selected from the group consisting of propylene glycol monomethylether (PGME), propylene glycol monomethylether acetate (PGMEA), cyclohexanone, γ-butyrolactone, ethyl lactate (EL), methyl ethyl ketone, n-butyl acetate, N-methylpyrrolidone (NMP), methyl 3-methoxypropionate (MMP), ethyl 3-ethoxypropionate (EEP), and dimethylformamide (DMF).

The surfactant may be one or a mixture of at least two selected from the group consisting of nonionic surfactants, such as polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene lauryl ethers, and polyoxyethylene sorbitans.

The surfactant may function to lower surface tension, thereby increasing spreadability or permeability to thereby contribute to an improvement in coatability or gap-filling performance.

Another aspect of the present disclosure pertains to a patterning method, including forming a hard mask layer by applying the composition on an etching target layer through spin coating and baking the composition.

The spin coating thickness of the composition may be in the range of from 100 Å to 30,000 Å, but is not is not particularly limited thereto.

The baking may be performed at a temperature of 150° C. to 400° C. for 1 to 5 minutes. During the baking process, the composition may undergo a self-crosslinking reaction.

Hereinafter, preferred Examples and Comparative Examples of the present disclosure will be described below. However, the following Examples are only examples of the present disclosure, and the present disclosure is not limited thereto.

MODE FOR INVENTION

Example 1

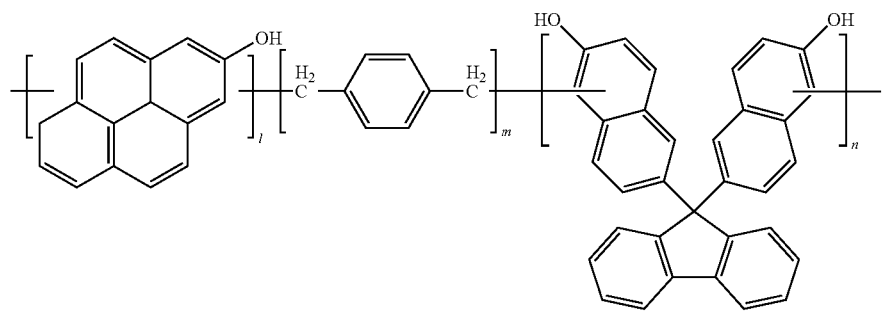

18 g of 1-hydroxypyrene, 9.5 g of 1,4-bismethoxymethylbenzene, 20 g of 9,9-bis(6-hydroxy-2-naphthyl)fluorene, and 150 g of propylene glycol monomethylether acetate (PGMEA) were mixed, and a nitrogen atmosphere was created. Then, 0.20 g of diethyl sulfate was added thereto, and the resulting solution was heated to 140° C. and then refluxed for 18 hours. After termination of the reaction, the resulting solution was purified with a hexane/methanol/water (1:1:1) solution, recrystallized using a methanol/water (10:1) solution, and dried in a vacuum, thereby obtaining a polymer compound having a weight average molecular weight (Mw) of 10,500, as measured by GPC based on standard polystyrene.

Example 2

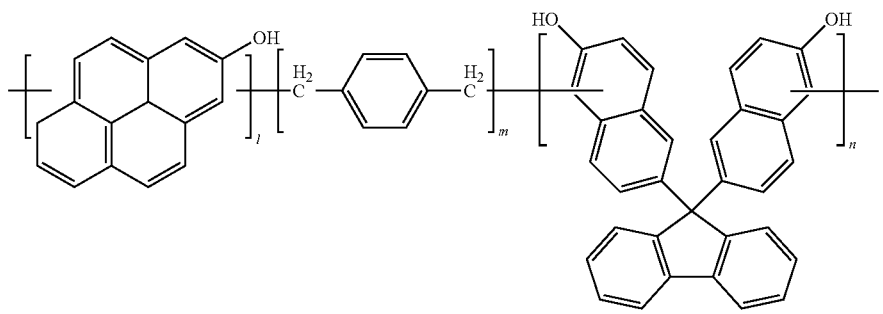

A polymer compound was synthesized in the same manner as in Example 1, except that the resulting solution was heated to 140° C. and then refluxed for 6 hours. The weight average molecular weight (Mw) of the polymer compound thus obtained was 1,900 as measured by GPC based on standard polystyrene.

Example 3

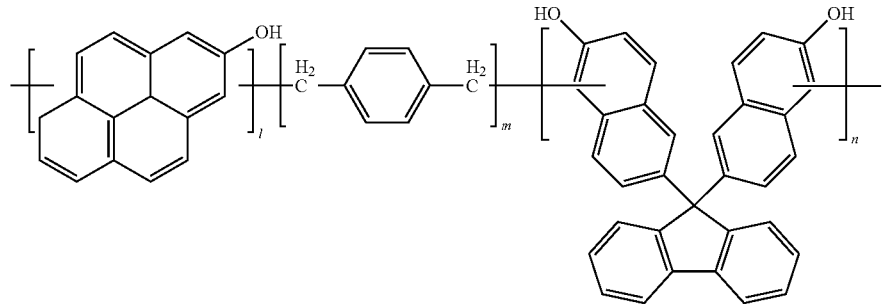

A polymer compound was synthesized in the same manner as in Example 1, except that 0.40 g of diethyl sulfate was added thereto, and the resulting solution was heated to 140° C. and then refluxed for 36 hours. The weight average molecular weight (Mw) of the polymer compound thus obtained was 25,000 as measured by GPC based on standard polystyrene.

Example 4

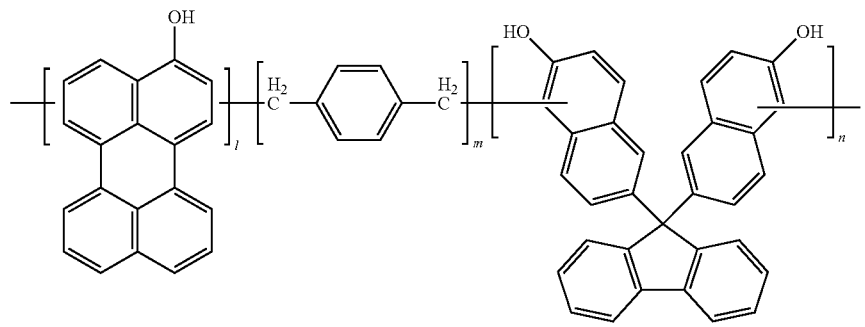

A polymer compound was synthesized in the same manner as in Example 1, except that 25 g of 3-hydroxyperylene was added in lieu of 1-hydroxypyrene. The weight average molecular weight (Mw) of the polymer compound thus obtained was 9,500 as measured by GPC based on standard polystyrene.

Example 5

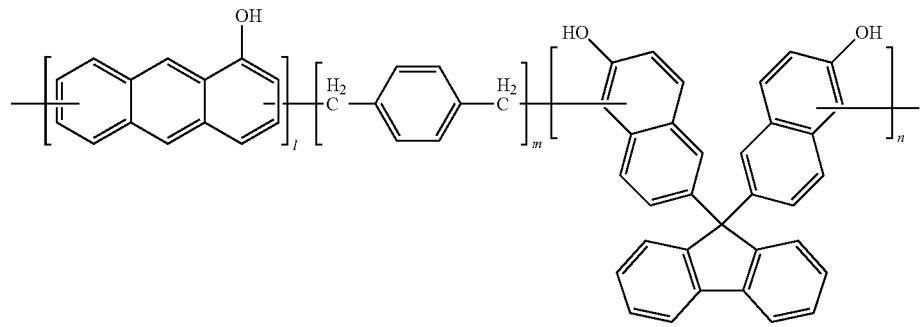

A polymer compound was synthesized in the same manner as in Example 1, except that 23 g of 1-anthrol was added in lieu of 1-hydroxypyrene. The weight average molecular weight (Mw) of the polymer compound thus obtained was 8,500 as measured by GPC based on standard polystyrene.

Example 6

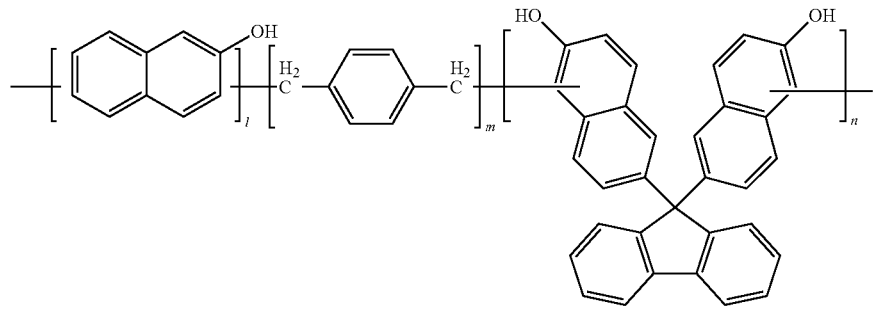

A polymer compound was synthesized in the same manner as in Example 1, except that 19 g of 2-naphthol was added in lieu of 1-hydroxypyrene. The weight average molecular weight (Mw) of the polymer compound thus obtained was 7,500 as measured by GPC based on standard polystyrene.

Comparative Example 1

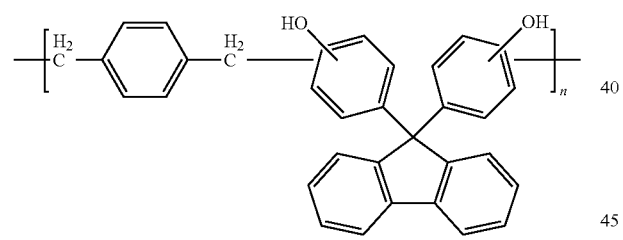

20 g of 9,9-bis(4-hydroxyphenyl)fluorene and 9.5 g of 1,4-bismethoxymethylbenzene were added with 70 g of PGMEA, after which 0.20 g of diethyl sulfate was added thereto. Then, the same synthesis procedure as in Example 1 was performed, thereby obtaining a polymer compound, the weight average molecular weight (Mw) of which was 9,000 as measured by GPC based on standard polystyrene.

Comparative Example 2

The same synthesis procedure as in Comparative Example 1 was performed, except that the reaction time was set to 6 hr, to obtain a polymer compound. The weight average molecular weight (Mw) of the polymer compound thus obtained was 1,800 as measured by GPC based on standard polystyrene.

Comparative Example 3

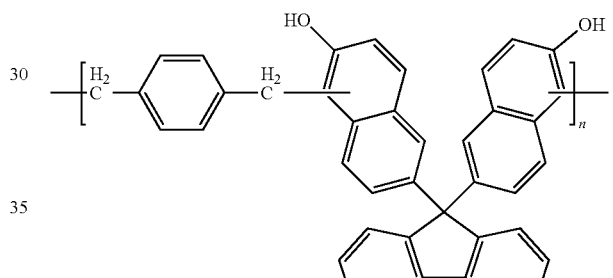

22 g of 9,9-bis(6-hydroxy-2-naphthyl)fluorene and 9.5 g of 1,4-bismethoxymethylbenzene were added with 150 g of PGMEA, after which 0.20 g of diethyl sulfate was added thereto. Then, the same synthesis procedure as in Example 1 was performed, thereby obtaining a polymer compound, the weight average molecular weight (Mw) of which was 9,700 as measured by GPC based on standard polystyrene.

Test Example 1

3.0 g of the polymer compound obtained in Example 1, 37.6 g of propylene glycol monomethylether acetate, and 9.7 g of cyclohexanone were added and stirred for 20 hours until dissolving. The resulting solution was filtered through a 0.2-μm microfilter, thus preparing a composition for forming a hard mask layer, which was then applied on a silicon wafer using a spin coater. The coated wafer was heated on a hot plate using the sequence of 240° C. for 1 minute and 400° C. for 1 minute, thereby forming a hard mask layer.

Test Example 2

The same procedure as in Test Example 1 was performed, except that 3.0 g of the polymer compound obtained in Example 2 was used.

Test Example 3

The same procedure as in Test Example 1 was performed, except that 3.0 g of the polymer compound obtained in Example 3 was used.

Test Example 4

The same procedure as in Test Example 1 was performed, except that 3.0 g of the polymer compound obtained in Example 4 was used.

Test Example 5

The same procedure as in Test Example 1 was performed, except that 3.0 g of the polymer compound obtained in Example 5 was used.

Test Example 6

The same procedure as in Test Example 1 was performed, except that 3.0 g of the polymer compound obtained in Example 6 was used.

Test Example 7

The same procedure as in Test Example 1 was performed, except that 17.0 g of the polymer compound obtained in Example 1, 26.4 g of propylene glycol monomethylether acetate, and 6.6 g of cyclohexanone were used.

Test Example 8

The same procedure as in Test Example 7 was performed, except that 17.0 g of the polymer compound obtained in Example 2 was used.

Test Example 9

The same procedure as in Test Example 7 was performed, except that 17.0 g of the polymer compound obtained in Example 3 was used.

Test Example 10

The same procedure as in Test Example 7 was performed, except that 17.0 g of the polymer compound obtained in Example 4 was used.

Test Example 11

The same procedure as in Test Example 7 was performed, except that 17.0 g of the polymer compound obtained in Example 5 was used.

Test Example 12

The same procedure as in Test Example 7 was performed, except that 17.0 g of the polymer compound obtained in Example 6 was used.

Comparative Test Example 1

The same procedure as in Test Example 1 was performed, except that 3.0 g of the polymer compound obtained in Comparative Example 1 was used.

Comparative Test Example 2

The same procedure as in Test Example 1 was performed, except that 3.0 g of the polymer compound obtained in Comparative Example 2 was used.

Comparative Test Example 3

The same procedure as in Test Example 1 was performed, except that 3.0 g of the polymer compound obtained in Comparative Example 3 was used.

Comparative Test Example 4

The same procedure as in Test Example 7 was performed, except that 17.0 g of the polymer compound obtained in Comparative Example 1 was used.

Comparative Test Example 5

The same procedure as in Test Example 7 was performed, except that 17.0 g of the polymer compound obtained in Comparative Example 2 was used.

Comparative Test Example 6

The same procedure as in Test Example 7 was performed, except that 17.0 g of the polymer compound obtained in Comparative Example 3 was used.

<Measurement of Weight Average Molecular Weight>

The weight average molecular weight of the polymer of each of Examples was measured through gel permeation chromatography (GPC). The measurement was performed using a GPC device made by WATERS, and the measurement conditions were as follows.

Column temperature: 40° C., mobile phase: tetrahydrofuran (THF), flow rate: 1 mL/1 min, GPC column: STYRAGEL KF-801, 802, 803 (made by WATERS, 8×300 mm).

<Test of Coating Thickness>

The thickness of the hard mask layer formed in each of Test Examples 1 to 12 and Comparative Test Examples 1 to 6 was measured. The results are illustrated in Table 1 below. The measurement was performed using an ellipsometer (Horiba).

TABLE 1

| | Sample | Coating thickness (nm) | Coatability |
|---|---|---|---|
| Test Example 1 | Example 1 | 150 | Good |
| Test Example 2 | Example 2 | 110 | Good |
| Test Example 3 | Example 3 | 230 | Good |
| Test Example 4 | Example 4 | 160 | Good |
| Test Example 5 | Example 5 | 145 | Good |
| Test Example 6 | Example 6 | 140 | Good |
| Test Example 7 | Example 1 | 2800 | Good |
| Test Example 8 | Example 2 | 2200 | Good |
| Test Example 9 | Example 3 | 3040 | Poor |
| Test Example 10 | Example 4 | 2870 | Good |
| Test Example 11 | Example 5 | 2650 | Good |
| Test Example 12 | Example 6 | 2520 | Good |
| Comparative Test Example 1 | Comparative Example 1 | 130 | Good |
| Comparative Test Example 2 | Comparative Example 2 | 100 | Good |
| Comparative Test Example 3 | Comparative Example 3 | 139 | Good |
| Comparative Test Example 4 | Comparative Example 1 | 2380 | Poor |

TABLE 1-continued

| Sample | | Coating thickness (nm) | Coatability |
|---|---|---|---|
| Comparative Test Example 5 | Comparative Example 2 | 1850 | Poor |
| Comparative Test Example 6 | Comparative Example 3 | 2450 | Poor |

<Test of Optical Properties> The refractive index n and extinction coefficient k of the hard mask layer formed in each of Test Examples 1 to 12 and Comparative Test Examples 1 to 6 were measured. The results are illustrated in Table 2 below. The measurement was performed using an ellipsometer (Horiba).

TABLE 2

| Sample | | Refractive index (n@193 nm) | Extinction coefficient (k@193 nm) |
|---|---|---|---|
| Test Example 1 | Example 1 | 1.40 | 0.46 |
| Test Example 2 | Example 2 | 1.39 | 0.46 |
| Test Example 3 | Example 3 | 1.40 | 0.47 |
| Test Example 4 | Example 4 | 1.43 | 0.48 |
| Test Example 5 | Example 5 | 1.50 | 0.50 |
| Test Example 6 | Example 6 | 1.53 | 0.51 |
| Test Example 7 | Example 1 | 1.40 | 0.46 |
| Test Example 8 | Example 2 | 1.39 | 0.46 |
| Test Example 9 | Example 3 | — | — |
| Test Example 10 | Example 4 | 1.43 | 0.48 |
| Test Example 11 | Example 5 | 1.50 | 0.50 |
| Test Example 12 | Example 6 | 1.53 | 0.51 |
| Comparative Test Example 1 | Comparative Example 1 | 1.44 | 0.69 |
| Comparative Test Example 2 | Comparative Example 2 | 1.44 | 0.69 |
| Comparative Test Example 3 | Comparative Example 3 | 1.38 | 0.48 |
| Comparative Test Example 4 | Comparative Example 1 | — | — |
| Comparative Test Example 5 | Comparative Example 2 | — | — |
| Comparative Test Example 6 | Comparative Example 3 | — | — |

The refractive induces n and extinction coefficients k of the hard mask layer were measured as shown in Table 2 above, except for those formed in Test Example 9 and Comparative Test Examples 4 to 6, which were not measured due to poor coatability.

<Evaluation of Dry-Etching Characteristics> The hard mask layers formed in Test Examples 1 to 12 and Comparative Test Examples 1 to 6 were subjected to dry etching for 20 seconds using CF4 gas by means of a dry-etching device. The dry-etching rate was defined as [(film thickness before dry etching-film thickness after dry etching)/time]. The dry-etching characteristics refer to a dry-etching rate of a hard mark film when the dry-etching rate of an amorphous carbon layer (ACL) is taken as 100%, and the cross-section of each hard mask layer was observed using a field emission scanning electron microscope (FE-SEM, Hitachi). The results are illustrated in Table 3 below.

TABLE 3

| Sample | | CF4 etching characteristics compared to ACL |
|---|---|---|
| Test Example 1 | Example 1 | 92.0% |
| Test Example 2 | Example 2 | 88.0% |
| Test Example 3 | Example 3 | 93.0% |
| Test Example 4 | Example 4 | 93.5% |
| Test Example 5 | Example 5 | 91.0% |
| Test Example 6 | Example 6 | 90.0% |
| Test Example 7 | Example 1 | 92.0% |
| Test Example 8 | Example 2 | 88.0% |
| Test Example 9 | Example 3 | 92.8% |
| Test Example 10 | Example 4 | 93.3% |
| Test Example 11 | Example 5 | 90.6% |
| Test Example 12 | Example 6 | 90.3% |
| Comparative Test Example 1 | Comparative Example 1 | 81.0% |
| Comparative Test Example 2 | Comparative Example 2 | 56.4% |
| Comparative Test Example 3 | Comparative Example 3 | 84.0% |
| Comparative Test Example 4 | Comparative Example 1 | — |
| Comparative Test Example 5 | Comparative Example 2 | — |
| Comparative Test Example 6 | Comparative Example 3 | — |
| ACL | | 100% |

A hard mask layer with excellent etching resistance means that the dry etching rate of the hard mask layer is about 90% of the dry etching rate of an amorphous carbon layer. The results of Test Examples 1 to 12 and Comparative Test Examples 1 to 6 revealed that the dry etching rate was about 90%, meaning excellent etching resistance. Although the present disclosure has been described in detail with reference to the specific features, it will be apparent to those skilled in the art that this description is only for a preferred embodiment and does not limit the scope of the present disclosure. Thus, the substantial scope of the present disclosure will be defined by the appended claims and equivalents thereof.

The invention claimed is:

1. A spin-on carbon hard mask composition comprising: 1 to 50 wt % of a polymer having a weight average molecular weight of 1,900 to 10,500, as a polymer having a structure represented by the following Chemical Formulas 2, 3, or 4;

50 to 98 wt % of an organic solvent; and more than 0 to 2 wt % of a surfactant,

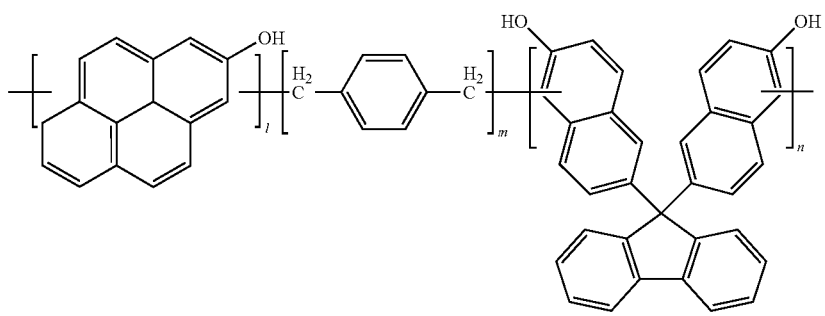

[Chemical Formula 2]

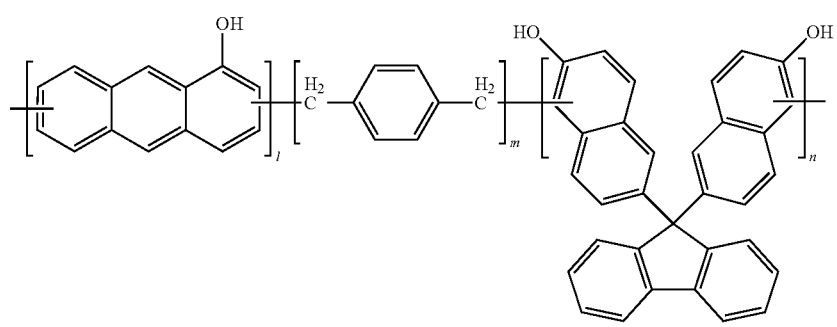

[Chemical Formula 3]

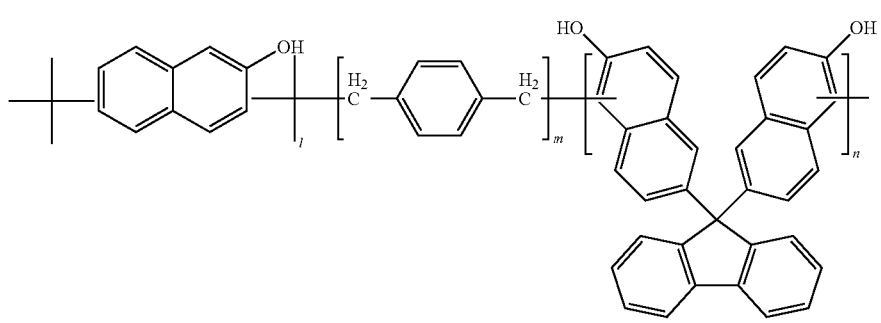

[Chemical Formula 4]

wherein in Chemical Formulas 2 to 4, l, m, and n are in the range of 1≤l≤40, 1≤m≤40, and 1≤n≤40, respectively.

2. The spin-on carbon hard mask composition of claim 1, wherein the organic solvent is one or a mixture of at least two selected from the group consisting of propylene glycol monomethylether (PGME), propylene glycol monomethylether acetate (PGMEA), cyclohexanone, γ-butyrolactone, ethyl lactate (EL), methyl ethyl ketone, n-butyl acetate, N-methylpyrrolidone (NMP), methyl 3-methoxypropionate (MMP), ethyl 3-ethoxypropionate (EEP), and dimethylformamide (DMF).

3. The spin-on carbon hard mask composition of claim 1, wherein the surfactant is one or a mixture of at least two selected from the group consisting of polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene lauryl ethers, and polyoxyethylene sorbitans.

4. The spin-on carbon hard mask composition of claim 1, wherein the organic solvent is one or a mixture of at least two selected from the group consisting of propylene glycol monomethylether (PGME), propylene glycol monomethylether acetate (PGMEA), cyclohexanone, γ-butyrolactone, ethyl lactate (EL), methyl ethyl ketone, n-butyl acetate, N-methylpyrrolidone (NMP), methyl 3-methoxypropionate (MMP), ethyl 3-ethoxypropionate (EEP), and dimethylformamide (DMF).

5. The spin-on carbon hard mask composition of claim 1, wherein the surfactant is one or a mixture of at least two selected from the group consisting of polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene lauryl ethers, and polyoxyethylene sorbitans.

6. A patterning method comprising forming a hard mask layer by:
applying the spin-on hard mask composition of claim 1 on an etching target layer through spin coating; and
baking the composition.

7. The patterning method of claim 6, wherein the baking is performed at a temperature of 150° C. to 400° C. for 1 to 5 minutes, thereby forming the hard mask layer.

* * * * *